(12) United States Patent
Hirao et al.

(10) Patent No.: US 6,709,111 B2
(45) Date of Patent: Mar. 23, 2004

(54) COOLING FAN CONTROLLER AND LIQUID CRYSTAL PROJECTOR

(75) Inventors: Yoshichika Hirao, Neyagawa (JP); Naoki Kaise, Higashiosaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/157,056

(22) Filed: May 30, 2002

(65) Prior Publication Data

US 2002/0196606 A1 Dec. 26, 2002

(30) Foreign Application Priority Data

Jun. 1, 2001 (JP) .......................................... 2001-167174

(51) Int. Cl.[7] .......................... G03B 21/18; G02F 1/1335
(52) U.S. Cl. ........................... 353/52; 353/57; 353/58; 349/5
(58) Field of Search .................... 353/52, 57, 58; 362/293, 294; 349/5

(56) References Cited

U.S. PATENT DOCUMENTS

| | | | |
|---|---|---|---|
| 6,350,033 B1 | * 2/2002 | Fujimori | ...................... 353/61 |
| 6,494,381 B2 | * 12/2002 | Bulthuis | ...................... 236/49.3 |
| 6,543,900 B2 | * 4/2003 | Noji et al. | ...................... 353/94 |
| 6,550,920 B2 | * 4/2003 | Hosoda et al. | ................. 353/58 |
| 2002/0191158 A1 | * 12/2002 | Koyama et al. | ............... 353/31 |
| 2003/0020884 A1 | * 1/2003 | Okada et al. | .................. 353/57 |

* cited by examiner

*Primary Examiner*—Russell Adams
*Assistant Examiner*—Melissa J Koval

(57) ABSTRACT

A cooling fan controller controls a voltage for driving a cooling fan on the basis of a temperature detected by a temperature sensor. A first controller controls voltage for driving the cooling fan to a minimum voltage for starting the cooling fan. A second controller controls the voltage for driving the cooling fan to a driving voltage value corresponding to the detected temperature after the cooling fan is started. A relationship between the detected temperature in the voltage for driving the cooling fan is such that the higher the detected temperature becomes the larger the voltage for driving the cooling fan becomes. A predetermined minimum voltage for cooling fan control is lower than the minimum voltage for starting the cooling fan and a predetermined maximum voltage for cooling fan control is higher than the minimum voltage for starting the cooling fan.

4 Claims, 4 Drawing Sheets

COOLING FAN CONTROLLER AND LIQUID CRYSTAL PROJECTOR

BACKGROUND OF THE INVENTION

1. Field of the Invention

The present invention relates to a cooling fan controller and a liquid crystal projector.

2. Description of the Prior Art

A liquid crystal panel, a light source lamp for backlight arranged on a rear surface of the liquid crystal panel, a signal processing circuit, and a power supply circuit are provided inside a casing of a liquid crystal projector. Further, a cooling fan for cooling the liquid crystal panel, the light source lamp for backlight, and so forth is provided inside the casing of the liquid crystal projector. Conventionally, the higher the rotational speed of the cooling fan is, the more the cooling efficiency increases, but the more noise increases.

Therefore, a technique for detecting a temperature in the liquid crystal projector by a temperature sensor arranged in the casing and controlling the rotational speed of the cooling fan on the basis of the detected temperature has been developed. That is, the cooling fan is controlled such that the rotational speed of the cooling fan is reduced when the temperature in the liquid crystal projector (hereinafter referred to as interior temperature) is low, while being increased as the interior temperature increases.

FIG. 5 illustrates the relationship between a voltage for driving a motor for driving the cooling fan (hereinafter referred to as a fan motor) and the number of revolutions (the rotational speed).

In FIG. 5, V1 represents a minimum voltage required to rotate the fan motor from a stopped state (hereinafter referred to as a minimum voltage for fan starting). After the fan motor is rotated once, it can be rotated even if the driving voltage is dropped in a range from a predetermined voltage V0 lower than the minimum voltage for fan starting V1 to the voltage V1. V0 represents a minimum voltage for fan control, and V2 represents a maximum voltage for fan control.

Conventionally, a fan motor control voltage (a voltage for driving a cooling fan) V is controlled such that a relationship as shown in FIG. 6 exists between the interior temperature T and the fan motor control voltage V.

The relationship between the interior temperature T and the fan motor control voltage V is as follows:

(1) When the interior temperature T is not more than a set minimum temperature for fan control Ta, the fan motor control voltage V is the minimum voltage for fan starting V1.

(2) When the interior temperature T is more than the set minimum temperature for fan control Ta and is a set maximum temperature for fan control Tb (Tb>Ta), the higher the interior temperature T is, the higher the fan motor control voltage V becomes within a range from V1 to V2.

(3) When the interior temperature T is more than the set maximum temperature for fan control Tb, the fan motor control voltage V is V2.

In a case where a power supply to the liquid crystal projector is turned on and in a time period elapsed since the power supply was turned on, the interior temperature is lower than the set minimum temperature for fan control Ta. In the conventional example, however, the fan motor control voltage V cannot be conventionally made lower than the minimum voltage for fan starting V1 irrespective of the fact that the interior temperature T is lower than the set minimum temperature for fan control Ta in the case where the power supply is turned on and in the predetermined time period elapsed since the power supply was turned on. Therefore, noise cannot be further reduced.

SUMMARY OF THE INVENTION

An object of the present invention is to provide a cooling fan controller and a liquid crystal projector, in which noise can be reduced.

In a cooling fan controller that controls a voltage for driving a cooling fan on the basis of a temperature detected by a temperature sensor, a first cooling fan controller according to the present invention is characterized by comprising means for controlling the voltage for driving the cooling fan to a minimum voltage for cooling fan starting which is required to start the cooling fan when the cooling fan is started; and means for controlling, on the basis of a predetermined relationship between the detected temperature and the voltage for driving the cooling fan, the voltage for driving the cooling fan to a driving voltage value corresponding to the detected temperature after the cooling fan is started, the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

In a cooling fan controller that controls a voltage for driving a cooling fan on the basis of a temperature detected by a temperature sensor, a second cooling fan controller according to the present invention is characterized by comprising a circuit for controlling the voltage for driving the cooling fan to a minimum voltage for cooling fan starting which is required to start the cooling fan when the cooling fan is started; and a circuit for controlling, on the basis of a predetermined relationship between the detected temperature and the voltage for driving the cooling fan, the voltage for driving the cooling fan to a driving voltage value corresponding to the detected temperature after the cooling fan is started, the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

In a liquid crystal projector comprising a temperature sensor that detects the interior temperature of the liquid crystal projector and a cooling fan controller that controls a voltage for driving a cooling fan on the basis of a temperature detected by the temperature sensor, a first liquid crystal projector according to the present invention is characterized in that the cooling fan controller comprises means for controlling the voltage for driving the cooling fan to a minimum voltage for cooling fan starting which is required to start the cooling fan when the cooling fan is started, and means for controlling, on the basis of a predetermined relationship between the detected temperature and the voltage for driving the cooling fan, the voltage for driving the cooling fan to a driving voltage value corresponding to the detected temperature after the cooling fan is started, the relationship between the detected temperature and the voltage for driving the cooling fan being determined such that the higher the detected temperature becomes, the larger the voltage for driving the cooling fan becomes in a range from a predetermined minimum voltage for fan control which is lower than the minimum voltage for cooling fan starting to a predetermined maximum voltage for cooling fan control which is higher than the minimum voltage for cooling fan starting.

In a liquid crystal projector comprising a temperature sensor that detects the interior temperature of the liquid crystal projector and a cooling fan controller that controls a voltage for driving a cooling fan on the basis of a temperature detected by the temperature sensor, a second liquid crystal projector according to the present invention is characterized in that the cooling fan controller comprises a circuit for controlling the voltage for driving the cooling fan to a minimum voltage for cooling fan starting which is required to start the cooling fan when the cooling fan is started, and a circuit for controlling, on the basis of a predetermined relationship between the detected temperature and the voltage for driving the cooling fan, the voltage for driving the cooling fan to a driving voltage value corresponding to the detected temperature after the cooling fan is started, the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
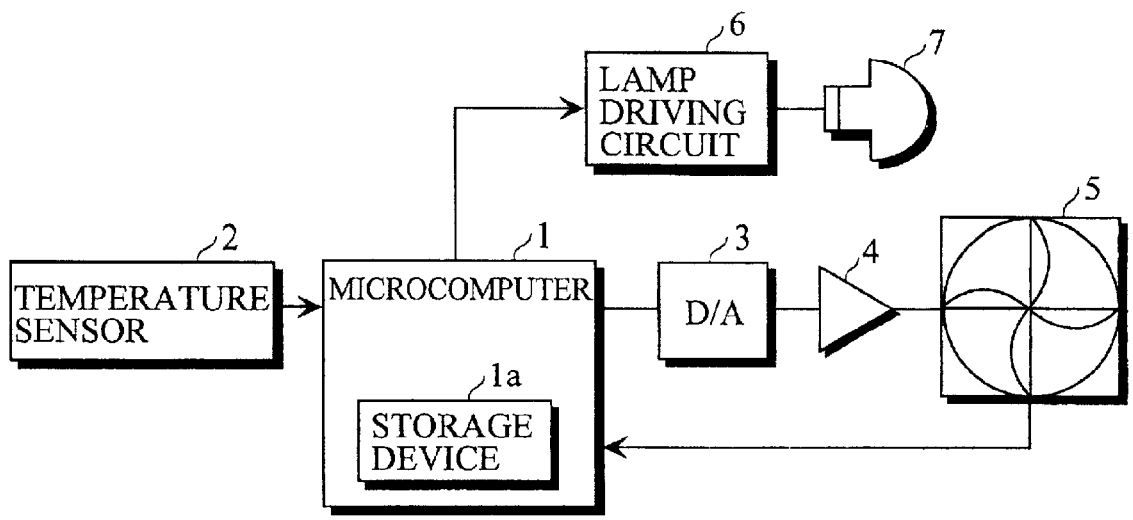
FIG. 1 is a block diagram showing a circuit for controlling a cooling fan provided in a liquid crystal projector and a circuit for controlling a light source lamp for backlight.

Referring now to the drawings, the present invention will be described with respect to an embodiment in a case where the present invention is applied to a liquid crystal projector.

FIG. 1 illustrates a circuit for controlling a cooling fan provided in a liquid crystal projector and a circuit for controlling a light source lamp for backlight.

Reference numeral 1 denotes a microcomputer. The microcomputer 1 comprises a storage device 1a. Reference numeral 2 denotes a temperature sensor arranged in a casing of the liquid crystal projector.

Figure 5:
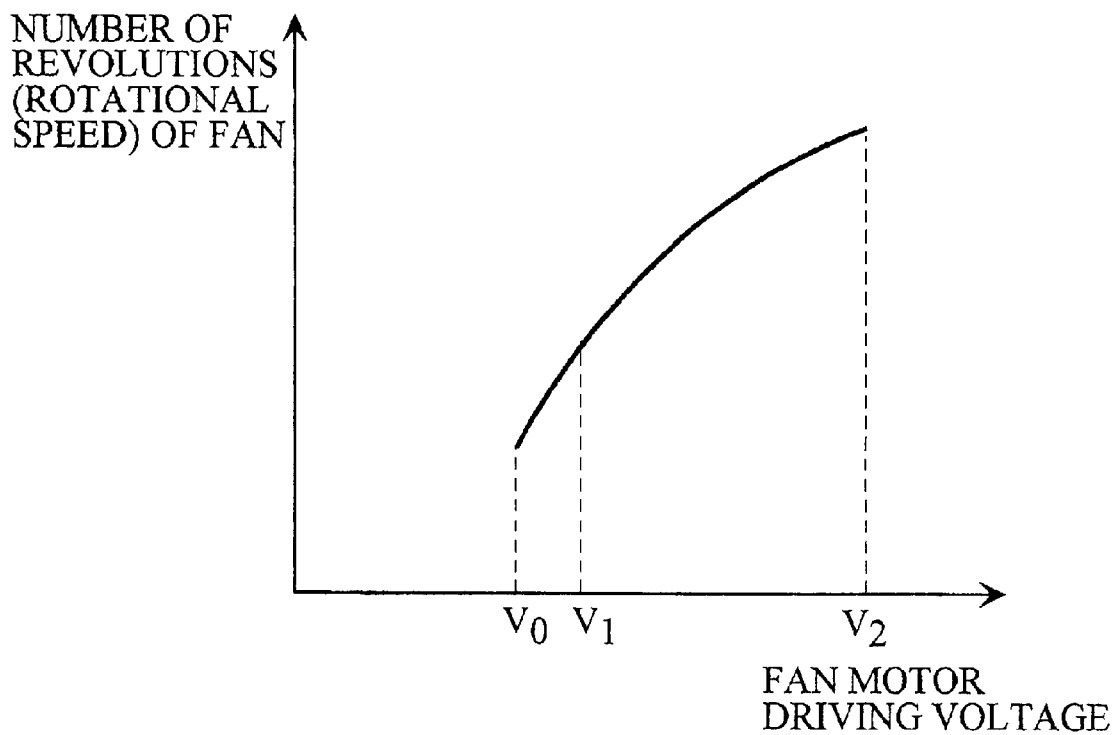
FIG. 5 is a graph showing the relationship between a voltage for driving a motor for driving a cooling fan and the number of revolutions.

Reference numeral 5 denotes a cooling fan arranged in the casing of the liquid crystal projector. An example of the cooling fan 5 is one comprising the function of outputting a signal indicating whether the fan is in a rotating state or a stopped state. The relationship between a voltage for driving a motor for driving the cooling fan 5 (hereinafter referred to as a fan motor) is the same as that in the conventional example, as shown in FIG. 5.

Reference numeral 3 denotes a D/A (Digital-to-Analog) converter for converting fan control data (digital data) from the microcomputer 1 into an analog voltage signal. Reference numeral 4 denotes a fan motor driving buffer for rotating the cooling fan 5 at a rotational speed corresponding to an output voltage of the D/A converter 3.

Reference numeral 7 denotes a light source lamp for backlight. Reference numeral 6 denotes a lamp driving circuit for driving and controlling the light source lamp for backlight 7 on the basis of a lamp control command from the microcomputer 1. The lamp driving circuit 6 turns the light source lamp for backlight 7 on on the basis of the lamp control command from the microcomputer 1 when a power supply to the liquid crystal projector is turned on.

The storage device 1a stores a temperature/control voltage table representing the relationship between an interior temperature T detected by the temperature sensor 2 and a fan motor control voltage V.

Figure 2:
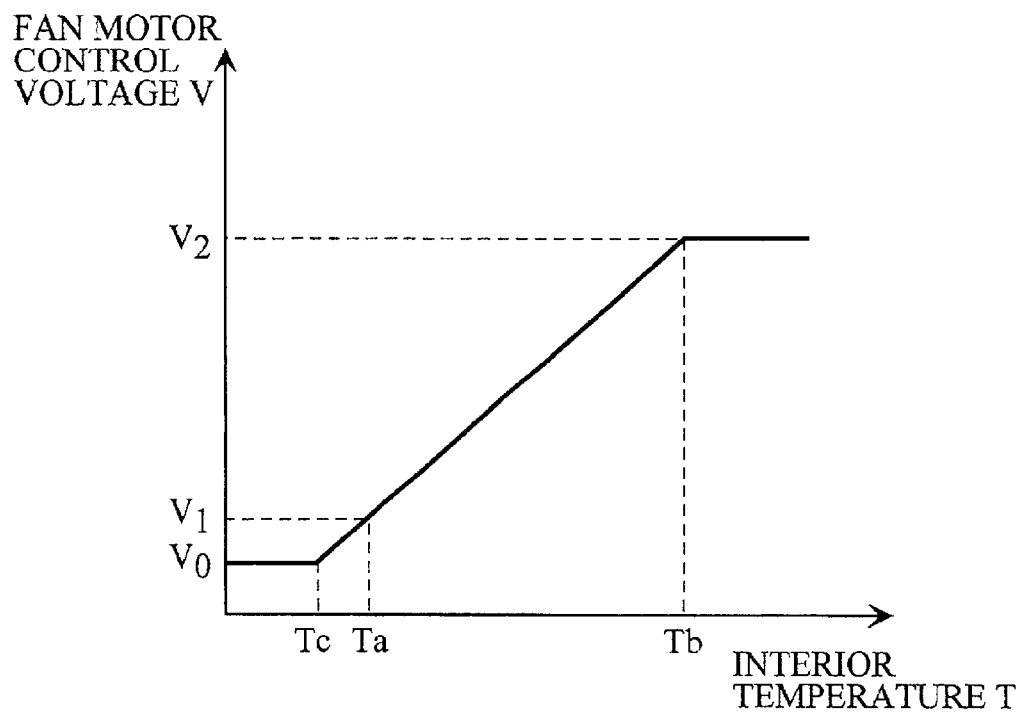
FIG. 2 is a graph showing the relationship between an interior temperature T detected by a temperature sensor 2 and a fan motor control voltage V.

FIG. 2 illustrates the relationship between the interior temperature detected by the temperature sensor 2 and the fan motor control voltage V.

In FIG. 2, V1 represents a minimum voltage required to rotate the fan motor from the stopped state (hereinafter referred to as a minimum voltage for fan starting). After the fan motor is rotated once, the fan motor can be rotated even if a driving voltage is dropped in a range from a predetermined voltage V0 lower than the minimum voltage for fan starting V1 to the voltage V1. V0 represents a minimum voltage for fan control, and V2 represents a maximum voltage for fan control.

When the fan motor is started, the fan motor control voltage V is set to the minimum voltage for fan starting V1. Thereafter, however, the fan motor control voltage V is controlled in a range from V0 to V2 depending on the interior temperature T.

Figure 6:
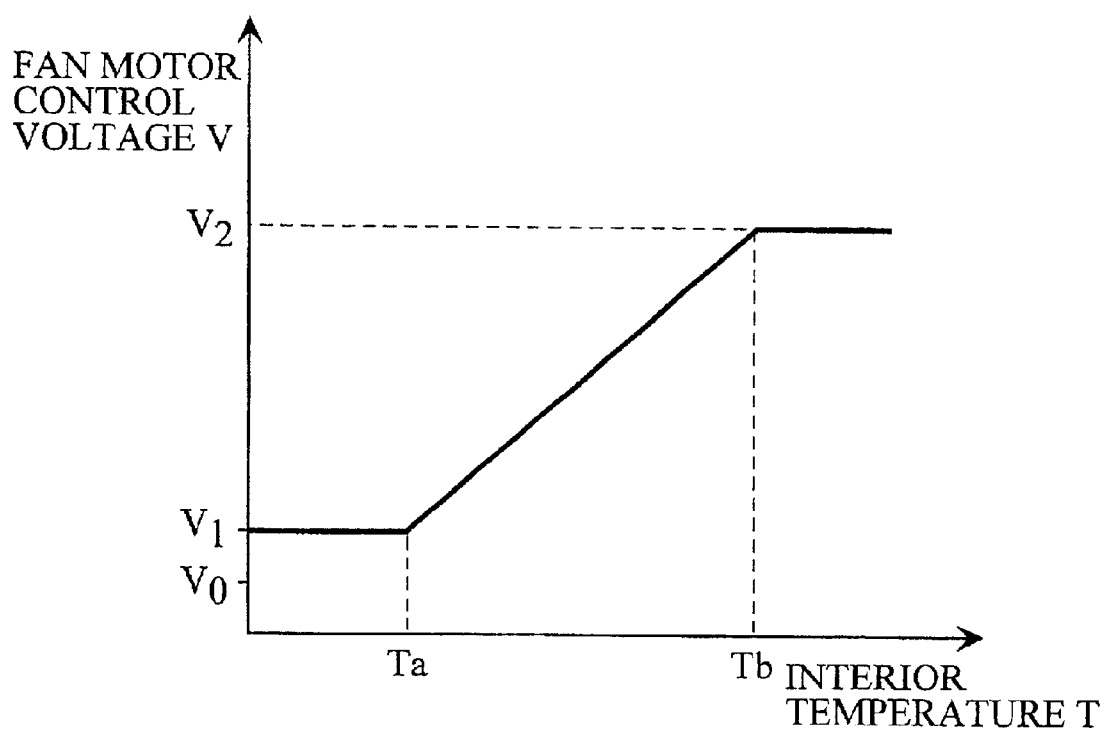
FIG. 6 is a graph showing the relationship between an interior temperature T and a fan motor control voltage V in a conventional example.

The relationship between the interior temperature T and the fan motor control voltage V after starting the fan motor is as follows:

(1) When the interior temperature T is not more than a set minimum temperature for fan control Tc (set to a value lower than a set minimum temperature for fan control Ta in the conventional example shown in FIG. 6), the fan motor control voltage V is V0.

(2) When the interior temperature T is more than the set minimum temperature for fan control Tc and is a set maximum temperature for fan control Tb (Tb>Tc), the higher the interior temperature T is, the higher the fan motor control voltage V becomes within the range from V0 to V2.

(3) When the interior temperature T is more than the set maximum temperature for fan control Tb, the fan motor control voltage V is V2.

Figure 3:
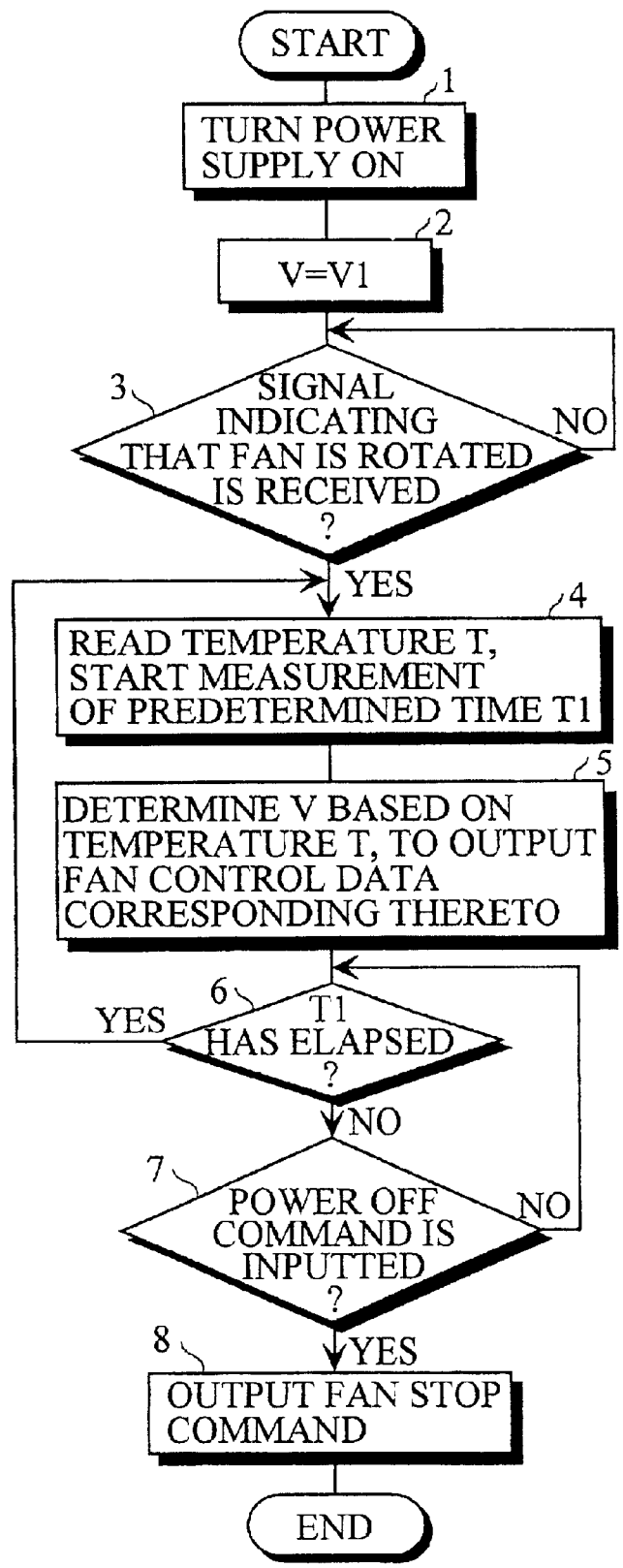
FIG. 3 is a flow chart showing the procedure for fan control processing by a microcomputer 1.

FIG. 3 shows the procedure for fan control processing by the microcomputer 1.

When the power supply is turned on (step 1), such fan control data that the fan motor control voltage V is the minimum voltage for fan starting V1 is outputted (step 2). Consequently, the cooling fan 5 is rotated.

After the step 2, a signal indicating that the cooling fan 5 is rotated is fed to the microcomputer 1 from the cooling fan 5 (step 3), the interior temperature T detected by the temperature sensor 2 is read, and the measurement of a predetermined time period T1 is started (step 4). The predetermined time period T1 is set to a value of approximately one second. The fan motor control voltage V is determined on the basis of the read interior temperature T and the temperature/control voltage table, to output fan control data corresponding thereto (step 5).

After the processing at the step 5, it is judged whether or not the predetermined time period T1 whose measurement is started at the step 4 has been elapsed (step 6), and it is judged whether or not a power off command is inputted (step 7). When the power off command is not inputted until the predetermined time period T1 has elapsed, the program is returned to the step 4, to perform the processing at the steps 4 to 7 again.

When the power off command is inputted (YES at step 7), a cooling fan stop command is outputted (step 8), to terminate the current fan control processing.

Figure 4:
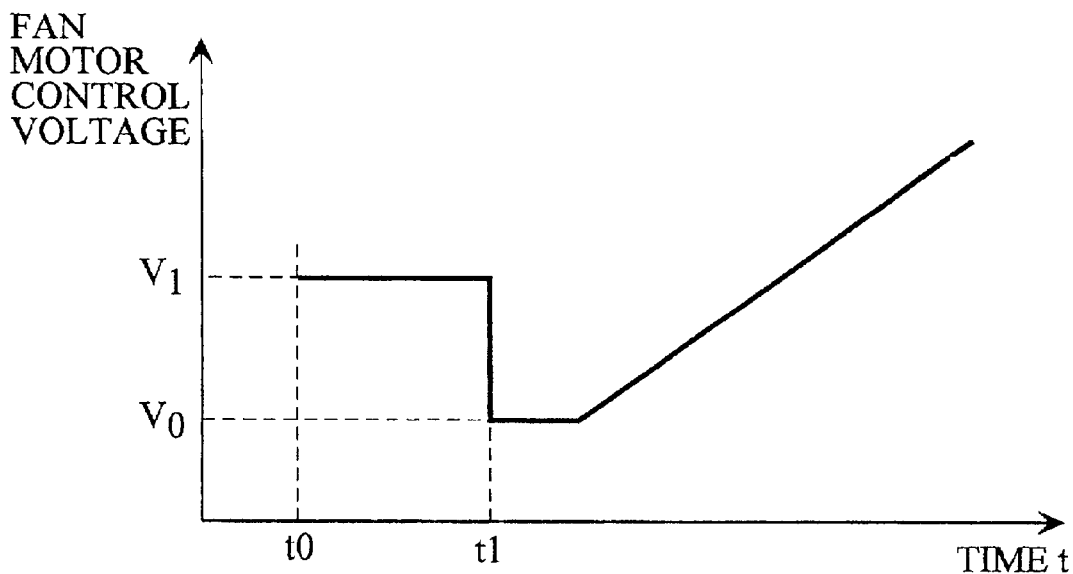
FIG. 4 is a timing chart showing the relationship between a time period elapsed since a power supply is turned on and a fan motor control voltage V.

FIG. 4 illustrates the relationship between a time period elapsed since the power supply was turned on and the fan motor control voltage V.

When the power supply is turned on (a time point t0), the fan motor control voltage V is set to the minimum voltage for fan starting V1 by the processing at the foregoing step 2. When a signal indicating that the cooling fan 5 is rotated is fed to the microcomputer 1 from the cooling fan 5 (a time point t1), the fan motor control voltage V is changed into a value corresponding to the interior temperature T by the processing at the foregoing step 4. Immediately after the cooling fan 5 is started, the interior temperature T is not more than the set minimum temperature for fan control Tc. Accordingly, the fan motor control voltage V is set to V0.

Thereafter, every time the predetermined time period T1 has elapsed, the interior temperature T is read, and the fan motor control voltage V is set to a value corresponding to the read interior temperature T. The interior temperature T rises with an elapse of a time period by heat generated by the light source lamp for backlight 7. Accordingly, the fan motor control voltage V gradually increases. That is, the rotational speed of the cooling fan 5 gradually increases.

In the present embodiment, the fan motor control voltage V is set to the minimum voltage for fan starting V1 when the power supply to the liquid crystal projector (the light source lamp for backlight 7) is turned on, as shown in FIG. 4. Immediately after that, therefore, the fan motor control voltage V is set to a value lower than the minimum voltage for fan starting V1. Accordingly, noise can be made lower than that in the conventional example.

The present invention is also applicable to equipment other than the liquid crystal projector, provided that the equipment comprises a cooling fan.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. In a cooling fan controller that controls a voltage for driving a cooling fan on the basis of a temperature detected by a temperature sensor, a cooling fan controller comprising:
   means for controlling the voltage for driving the cooling fan to a minimum voltage for cooling fan starting which is required to start the cooling fan when the cooling fan is started; and
   means for controlling, on the basis of a predetermined relationship between the detected temperature and the voltage for driving the cooling fan, the voltage for driving the cooling fan to a driving voltage value corresponding to the detected temperature after the cooling fan is started,
   the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

2. In a cooling fan controller that controls a voltage for driving a cooling fan on the basis of a temperature detected by a temperature sensor, a cooling fan controller comprising:
   a circuit for controlling the voltage for driving the cooling fan to a minimum voltage for cooling fan starting which is required to start the cooling fan when the cooling fan is started; and
   a circuit for controlling, on the basis of a predetermined relationship between the detected temperature and the voltage for driving the cooling fan, the voltage for driving the cooling fan to a driving voltage value corresponding to the detected temperature after the cooling fan is started,
   the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

3. In a liquid crystal projector comprising a temperature sensor that detects the interior temperature of the liquid crystal projector and a cooling fan controller that controls a voltage for driving a cooling fan on the basis of a temperature detected by the temperature sensor, a liquid crystal projector wherein
   the cooling fan controller comprises means for controlling the voltage for driving the cooling fan to a minimum voltage for cooling fan starting which is required to start the cooling fan when the cooling fan is started, and means for controlling, on the basis of a predetermined relationship between the detected temperature and the voltage for driving the cooling fan, the voltage for driving the cooling fan to a driving voltage value corresponding to the detected temperature after the cooling fan is started,
   the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

4. In a liquid crystal projector comprising a temperature sensor that detects the interior temperature of the liquid crystal projector and a cooling fan controller that controls a voltage for driving a cooling fan on the basis of a temperature detected by the temperature sensor, a liquid crystal projector wherein the cooling fan controller comprises a circuit for controlling the voltage for driving the cooling fan to a minimum voltage for cooling fan starting which is required to start the cooling fan when the cooling fan is started, and a circuit for controlling, on the basis of a predetermined relationship between the detected temperature and the voltage for driving the cooling fan, the voltage for driving the cooling fan to a driving voltage value corresponding to the detected temperature after the cooling fan is started, the relationship between the detected temperature and the voltage for driving the cooling fan being determined such that the higher the detected temperature becomes, the larger the voltage for driving the cooling fan becomes in a range from a predetermined minimum voltage for cooling fan control which is lower than the minimum voltage for cooling fan starting to a predetermined maximum voltage for cooling fan control which is higher than the minimum voltage for cooling fan starting.

* * * * *